United States Patent Office 2,966,432

Patented Dec. 27, 1960

2,966,432

SURFACE TREATMENT OF SILICON

Thomas M. Buck, Plainfield, N.J., assignor to Bell Telephone Laboratories, Incorporated, New York, N.Y., a corporation of New York No Drawing. Filed Jan. 15, 1958, Ser. No. 708,996

3 Claims. (Cl. 134—41)

This invention relates to the fabrication of silicon devices and more particularly to a surface treatment for the silicon bodies included in such devices.

It is well known that the electrical characteristics of many forms of semiconductive devices are affected by the rate or velocity of recombination of minority carriers at the surface of the semiconductive body included in each of such devices. It will be convenient to refer to the surface recombination velocity of minority carriers simply as the surface recombination velocity. For example, it is known that in an alloy junction transistor disadvantageously the current amplification factor is lower and the collector junction saturation current higher the higher the surface recombination velocity.

It is relatively difficult to realize a low surface recombination velocity in silicon. Several treatments are known for achieving this end, including boiling in deionized water as is described in copending application Serial No. 613,828, filed October 4, 1956, now Patent No. 2,916,407, and treating with sodium dichromate in the manner described in the R.C.A. Review, volume 17, pages 5–12, March 1956. However, each of these treatments results in a shift toward p-type conductivity of the surface of the body. Although for many applications such shift is unobjectionable, there are instances when it is objectionable and when instead a shift toward n-type conductivity would be preferred.

The present invention is directed particularly at a surface treatment for a silicon body which reduces the surface recombination velocity and produces a shift toward n-type conductivity at the surface.

The treatment in accordance with the invention comprises soaking the silicon body which had previously undergone the processing necessary for imparting desired electrical properties thereto in an aqueous solution of hydrofluoric acid to remove the oxide film which characteristically forms on the surface of a silicon body when exposed to an oxidizing atmosphere, removing the silicon body from the solution but leaving a residual film of adsorbed hydrofluoric acid molecules on the surface of the body, and encapsulating the body in a nonoxidizing atmosphere before an oxide film of any significance can grow on the surface.

This treatment both provides a significant decrease in the surface recombination velocity and shifts the surface conductivity toward n-type. It has been found important to avoid the regrowth of an oxide surface film if the surface recombination velocity is to be maintained at the reduced value. In particular, to this end it is important both to encapsulate the silicon body in a nonoxidizing environment and additionally to provide that at the time of such encapsulation the silicon body include an adsorbed surface film of hydrofluoric acid.

There will now be described in detail by way of illustration an exemplary treatment in accordance with the present invention for use in reducing the surface recombination rate and providing a shift toward n-type conductivity at the surface of a silicon body. In the interest of simplicity it will be assumed that the silicon body has already undergone the necessary fabrication steps for adapting it for use in a suitable silicon device, such as the formation of rectifying junctions therein and the attachment of electrodes. For an alloy junction transistor such fabrication includes the formation of the emitter and collector alloy regions and the attachment of leads thereto and to the base region.

As is the usual practice before encapsulation, the silicon body is advantageously first given a cleanup etch to remove any surface material damaged by the earlier fabrication treatment. Typically, the etchant may be a mixture in the ratio of ten to one by volume of an aqueous solution of nitric acid which is 70 percent by weight nitric acid and an aqueous solution of hydrofluoric acid which is 48 percent by weight hydrofluoric acid. Immersion in such a mixture for several minutes ordinarily provides adequate etching. Various alternative etchants are known.

After the etching, it is advantageous to wash the silicon element thoroughly in running deionized water, conveniently at room temperature.

Thereafter, in accordance with the present invention, the silicon element is immersed in an aqueous solution which is 48 percent by weight hydrofluoric acid the remainder water except for minor trace impurities characteristic of commercial grade hydrofluoric acid. Typically, such impurities include fluosilicic acid, chloride ions, phosphate ions, sulphate ions, sulphite ions and heavy metals. Optimum results have been obtained when extra measures are taken to minimize such trace impurities, although useful results have been achieved even when commercial grade hydrofluoric acid without purification is used.

This immersion is continued for a time sufficient to remove the surface oxide film that has inevitably formed over the surface of the silicon as a result of having been exposed to an oxidizing atmosphere during the fabrication process. This immersion does not result in an etching of elemental silicon and can be distinguished from the earlier immersion step in this regard. Typically, immersion for several minutes in the solution described will adequately remove the usual surface oxide film. As will be obvious to a worker in the art, the length of time of immersion necessary to remove the oxide film will depend on the thickness of the film and the acid concentration and temperature of the solution.

In particular, the treatment described generally results in a surface recombination velocity of about 100 centimeters/second as compared with a value typically 5000 centimeters/second before such treatment. Additionally, this treatment provides a shift toward n-type conductivity over the surface of the body. However, if in the absence of further precautions the surface oxide film is allowed to regrow, the improvement in surface recombination velocity and the shift in surface conductivity tend to disappear with time.

Accordingly, it is found important to encapsulate the silicon element in a nonoxidizing atmosphere before such oxide film can regrow. To this latter end it has been found advantageous to leave a residual film of adsorbed hydrofluoric acid molecules over the element after the immersion treatment described. This can be insured by avoiding any treatment of the element, after its removal from the hydrofluoric acid solution, which fails to leave a residual film of adsorbed hydrofluoric acid molecules. Accordingly, although it is feasible to subject the silicon element to a light wash of several seconds in deionized water to remove most of the hydrofluoric acid for ease in handling, such washing must not be carried to the point of removing all of the adsorbed hydrofluoric acid. In particular, it is important that the water be relatively free of impurities which might accelerate the oxidation of the surface or might remove all of the adsorbed hydrofluoric acid. In particular, it is important to maintain at least several monolayers of adsorbed hydrofluoric acid molecules.

It is generally desirable to have the encapsulation follow the removal of the silicon element from the hydrofluoric acid mixture as soon as practicable. In particular, the silicon elements should be left in an oxidizing atmosphere no longer than necessary, typically not for a time in excess of the order of tens of seconds.

Various techniques for encapsulation are feasible. Typically, such technique comprises mounting the silicon element on a suitable support structure within a container which is provided with an exhaust tubulation but is otherwise hermetically sealed and evacuating the container by way of the exhaust tubulation. If the nonoxidizing ambient is to be a vacuum, the tubulation is then sealed off. If the nonoxidizing ambient is to be one of the known inert atmospheres, such as nitrogen and argon, then the container is filled with such gas by way of the tubulation before sealing.

The principles of the invention find special application to situations where it is advantageous to induce a shift in surface conductivity toward n-type. Such applications include use with a p-n-p silicon alloy junction transistor in order to minimize surface channel effects and with diffused n+-p silicon diodes in order to minimize surface breakdown effects.

What is claimed is:

1. The process for reducing the surface recombination velocity of minority charge carriers with majority charge carriers of a silicon device which includes a p-n rectifying junction comprising the steps of exposing the silicon body included in such device to an aqueous solution of hydrofluoric acid for a time sufficient to remove any surface oxide film thereover and encapsulating the silicon body in a nonoxidizing environment before significant regrowth of a surface oxide film and while the silicon body still includes an adsorbed layer of hydrofluoric acid molecules.

2. The process for reducing the surface recombination velocity of minority charge carriers with majority charge carriers of a silicon device which includes a p-n rectifying junction comprising the steps of immersing the silicon body included in such device in a mixture consisting essentially of water and hydrofluoric acid for a time sufficient to remove any surface oxide film and to deposit over the surface an adsorbed film of hydrogen fluoride molecules and encapsulating the body including the adsorbed layer of hydrofluoric acid molecules in a nonoxidizing environment before significant regrowth of a surface oxide film.

3. The process of claim 2 in which the mixture is 48 percent by weight hydrofluoric acid and the remainder substantially only water and the immersion therein is for several minutes.

References Cited in the file of this patent

UNITED STATES PATENTS 2,419,237 Treuting ---------------- Apr. 22, 1947